(12) United States Patent
Tan et al.

(10) Patent No.: US 9,184,215 B2
(45) Date of Patent: Nov. 10, 2015

(54) RRAM STRUCTURE AT STI WITH SI-BASED SELECTOR

(71) Applicant: GLOBALFOUNDIRES Singapore Pte. Ltd., Singapore (SG)

(72) Inventors: Shyue Seng Tan, Singapore (SG); Eng Huat Toh, Singapore (SG); Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 36 days.

(21) Appl. No.: 14/179,655

(22) Filed: Feb. 13, 2014

(65) Prior Publication Data

US 2014/0158970 A1    Jun. 12, 2014

Related U.S. Application Data

(62) Division of application No. 13/611,817, filed on Sep. 12, 2012, now Pat. No. 8,685,799.

(51) Int. Cl.
*H01L 21/70* (2006.01)
*H01L 27/24* (2006.01)
*H01L 45/00* (2006.01)

(52) U.S. Cl.
CPC ........ *H01L 27/2436* (2013.01); *H01L 27/2445* (2013.01); *H01L 45/08* (2013.01); *H01L 45/124* (2013.01); *H01L 45/146* (2013.01); *H01L 45/1683* (2013.01)

(58) Field of Classification Search
CPC ... H01L 27/2436; H01L 45/08; H01L 45/124; H01L 45/146; H01L 45/1683; H01L 27/2445; H01L 27/2454; H01L 45/122; H01L 27/10844; H01L 27/11; H01L 27/1023; H01L 27/1024; H01L 27/108; H01L 2924/1434

USPC ......... 257/183, 187, 197, 205, 209, 310, 374, 257/499, 501, 506, 510, 517, 524, E27.001, 257/E27.006, E27.009, E27.075, E27.078
See application file for complete search history.

(56) References Cited

U.S. PATENT DOCUMENTS

| 7,067,865 B2 * | 6/2006 | Lung ............................. 257/296 |
| 7,189,627 B2 * | 3/2007 | Wu et al. ....................... 438/424 |
| 7,602,026 B2 * | 10/2009 | Horii et al. .................... 257/379 |

(Continued)

OTHER PUBLICATIONS

E.Y.H. Teo et al, "An Organic-Based Diode-Memory Device With Rectifying Property for Crossbar Memory Array Applications" IEEE Electron Device Letters, vol. 30, No. 5, May 2009, pp. 487-489.

(Continued)

*Primary Examiner* — Galina Yushina
(74) *Attorney, Agent, or Firm* — Ditthavong & Steiner, P.C.

(57) ABSTRACT

An RRAM at an STI region is disclosed with a vertical BJT selector. Embodiments include defining an STI region in a substrate, implanting dopants in the substrate to form a well of a first polarity around and below an STI region bottom portion, a band of a second polarity over the well on opposite sides of the STI region, and an active area of the first polarity over each band of second polarity at the surface of the substrate, forming a hardmask on the active areas, removing an STI region top portion to form a cavity, forming an RRAM liner on cavity side and bottom surfaces, forming a top electrode in the cavity, removing a portion of the hardmask to form spacers on opposite sides of the cavity, and implanting a dopant of the second polarity in a portion of each active area remote from the cavity.

20 Claims, 5 Drawing Sheets

(56) References Cited

U.S. PATENT DOCUMENTS

| | | | |
|---|---|---|---|
| 7,781,292 B2* | 8/2010 | Gambino et al. | 438/294 |
| 8,198,160 B2* | 6/2012 | Liu | 438/268 |
| 2004/0248339 A1 | 12/2004 | Lung | |
| 2006/0172504 A1 | 8/2006 | Sinitsky et al. | |
| 2007/0164351 A1* | 7/2007 | Hamamoto | 257/324 |
| 2009/0152608 A1 | 6/2009 | Choi | |
| 2013/0242649 A1 | 9/2013 | Pirovano | |

OTHER PUBLICATIONS

I.G. Baek et al. "Multilayer Cross-Point Binary Oxide Resistive Memory (OxRRAM) for Post-NAND Storage Application" Electron Devices Meeting, 2005, IEDM Technical Digest, pp. 750-753.

K. Tsunoda et al "Low Power and High Speed Switching of Ti-Doped NiO ReRAM Under the Unipolar Voltage Source of Less Than 3 V" Electron Devices Meeting, IEDM 2007, pp. 767-770.

M.J. Lee et al. "2-Stack 1D-1R Cross-Point Structure With Oxide Diodes as Switch Elements for High Density Resistance RAM Applications", Electron Devices Meeting, IEDM 2007, pp. 771-774.

P.F. Chiu et al. "A Low Store Energy, Low VDDMIN, Nonvolatile 8T2R SRAM With 3D Stacked RRAM Devices for Low Power Mobile Applications" IEEE Symposium on VLSI Circuits/Technical Digest of Technical Papers, 2010, pp. 229-230.

Y.H. Tseng et al. "High Density and Ultra Small Cell Size of Contact ReRAM (CR-RAM) in 90nm CMOS Logic Technology and Circuits", IEEE 2009, IEDM09-109 to IEDM09-112.

Z. Wei et al. "Highly Reliable TaOx ReRam and Direct Evidence of Redox Reaction Mechanism", 2008 IEEE, pp. 293-296.

\* cited by examiner

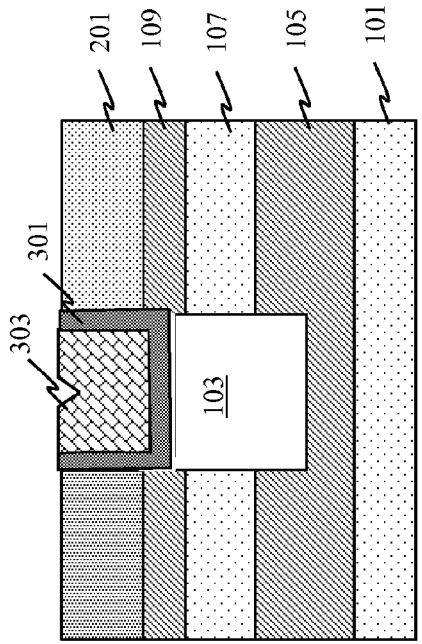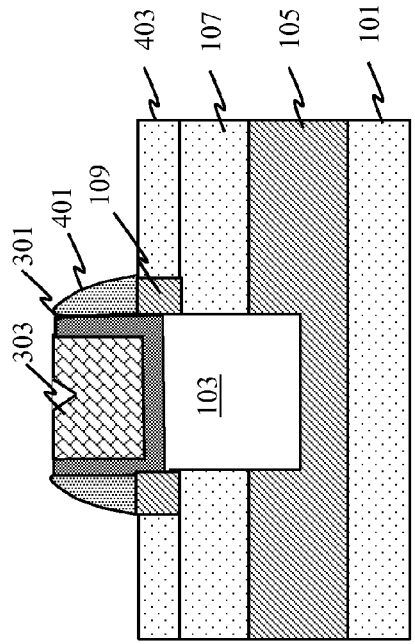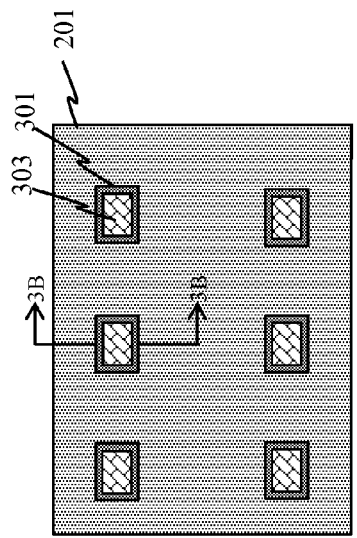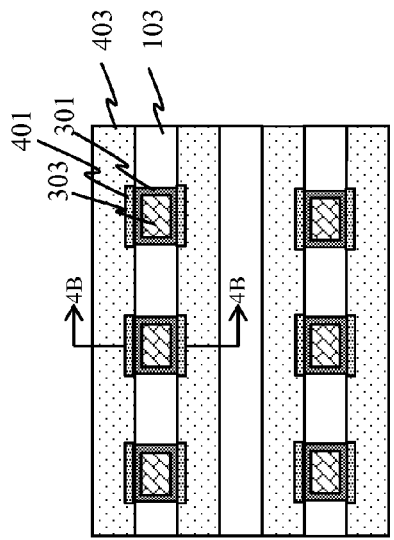
FIG. 3B
FIG. 4B
FIG. 3A
FIG. 4A

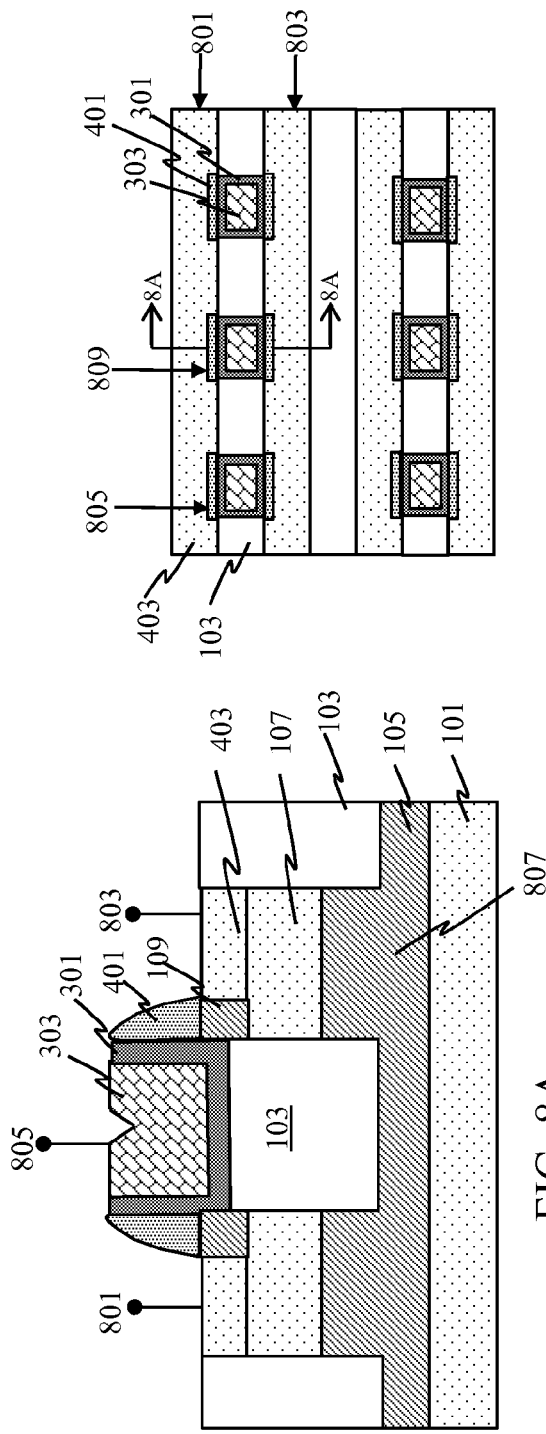
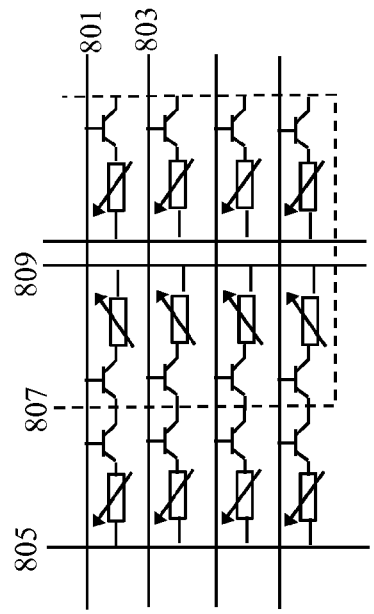
FIG. 8A
FIG. 8B
FIG. 8C

RRAM STRUCTURE AT STI WITH SI-BASED SELECTOR

CROSS-REFERENCED APPLICATION

This application is a division of U.S. application Ser. No. 13/611,817 filed Sep. 12, 2012, entirety of which is incorporated herein by reference.

TECHNICAL FIELD

The present disclosure relates to semiconductor memories. The present disclosure is particularly applicable to nonvolatile resistive random access memories (RRAMs).

BACKGROUND

Present flash technologies have encountered significant challenges for scaling such as scaling of program/erase (P/E) voltage, speed, reliability, number of charges stored per floating gate and their variability. Attempts to solve such issues have included employing RRAMs due to their scalability, highly competitive speed, endurance, and retention properties. RRAMs have been placed within contacts, above contacts, between M2 and M3 layers, and above backend layers. Single transistor single resistor (1T1R) RRAMs, which are desirably bipolar and have a high access current, also have a large cell size of $8F^2$ or higher and are not easily scalable. Single diode single resistor (1D1R) RRAMs, on the other hand, have a smaller cell size of $4F^2$ or higher, and are easily scalable, but are unipolar and have a low access current. In addition, 1D1R RRAMs employ metal oxide diodes or organic diodes, which are compatible with back-end-of-line (BEOL) processes because of processing temperatures less than 400° C. However, the diodes of such materials are not tunable, have inferior diode performance (i.e., low forward current due to large band-gap), which leads to larger cell area and a high Vdd of 3 to 4.5 V, which is not compatible with low Vdd technology.

A need therefore exists for methodology enabling fabrication of RRAMs which have a small cell size, are easily scalable, have a high access current, and are bipolar, and the resulting product.

SUMMARY

An aspect of the present disclosure is a method of fabricating a compact RRAM using an embedded vertical bipolar junction transistor (BJT).

Another aspect of the present disclosure is a compact RRAM using an embedded vertical BJT.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: defining a shallow trench isolation (STI) region in a substrate; implanting dopants in the substrate to form a well of a first polarity around and below a bottom portion of the STI region, a band of a second polarity over the well on opposite sides of the STI region, and an active area of the first polarity over each band of second polarity at the surface of the substrate; forming a hardmask on the active areas; removing a top portion of the STI region to form a cavity; forming an RRAM liner on side and bottom surfaces of the cavity; forming a top electrode in the cavity; removing a portion of the hardmask to form spacers on opposite sides of the cavity; and implanting a dopant of the second polarity in a portion of each active area remote from the cavity.

Aspects of the present disclosure include the bottom surface of the cavity being above a top surface of the band of a second polarity. Further aspects include forming the active areas with a shallow implant and implanting the dopant of the second polarity in each active area using multiple energies. Other aspects include activating all of the dopants after implanting the dopant of the second polarity in each active area. Another aspect includes forming the hardmask of silicon nitride. An additional aspect includes forming the RRAM liner to a thickness of 3 nanometers (nm) to 900 nm. Further aspects include the RRAM liner including an oxide of a transition metal. Other aspects include the top electrode including a transition metal, titanium nitride (TiN), TiN/Ti, or polysilicon.

Another aspect of the present disclosure is a method including defining a shallow trench isolation (STI) region in a substrate; implanting dopants in the substrate to form a well of a first polarity around and below a bottom portion of the STI region, a band of a second polarity over the well on opposite sides of the STI region, and an active area of the first polarity over each band of second polarity at the surface of the substrate; forming a hardmask on the active areas; removing a top portion of the STI region to form a cavity; forming a sacrificial top electrode in the cavity; removing a portion of the hardmask to form spacers on opposite sides of the cavity; implanting a dopant of the second polarity in a portion of each active area remote from the cavity; removing the sacrificial top electrode; forming an RRAM liner on side and bottom surfaces of the cavity; and forming a top electrode in the cavity.

Aspects include the bottom surface of the cavity being above a top surface of the band of a second polarity. Additional aspects include forming the active areas with a shallow implant and implanting the dopant of the second polarity in each active area using multiple energies. Other aspects include activating all of the dopants prior to removing the sacrificial top electrode. Another aspect includes forming a protection layer over the active areas prior to removing the sacrificial top electrode. Further aspects include forming the hardmask of silicon nitride. Additional aspects include forming the RRAM liner of an oxide of a transition metal and to a thickness of 3 nm to 900 nm. Further aspects include the top electrode including a transition metal, titanium nitride (TiN), TiN/Ti, or polysilicon.

Another aspect of the present disclosure is a device including: a substrate; a well of a first polarity in the substrate; a shallow trench isolation (STI) region formed in the substrate extending partially into the well; a band of a second polarity in the substrate, over the well, at opposite sides of the STI region; an area of the first polarity in the substrate over the band at opposite sides of each STI region; an area of the second polarity in the substrate over the band adjacent each area of the first polarity, remote from the STI region; a recess in a top surface of a portion of the STI region; an RRAM liner on side and bottom surfaces of the recess; and a top electrode in the recess, wherein the bottom surface of the recess is above a top surface of the band.

Aspects include the RRAM liner including an oxide of a transition metal. Further aspects include a thickness of the RRAM liner being 3 nm to 900 nm. Other aspects include the top electrode including a transition metal, titanium nitride (TiN), TiN/Ti, or polysilicon.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 4A and 1B through 4B schematically illustrate top views and cross-sectional views, respectively, of a process flow, in accordance with an exemplary embodiment;

FIGS. 5A through 7A and 5B through 7B schematically illustrate top views and cross-sectional views, respectively, of a process flow, in accordance with another exemplary embodiment; and FIGS. 8A through 8C schematically illustrate a layout scheme for the structures formed by the processes of the first and second embodiments.

DETAILED DESCRIPTION

Figure 1A:
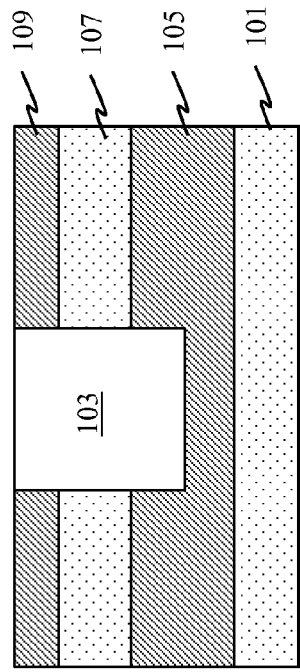
Figure 1B:
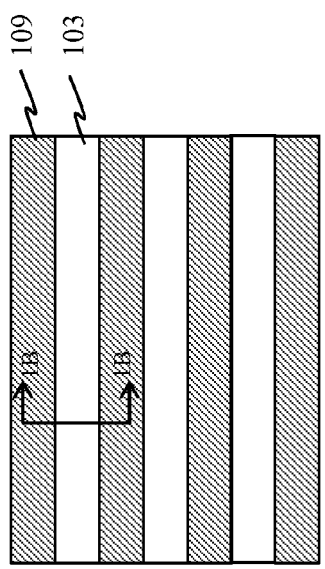

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of difficult scalability, low access current, large cell size and/or unipolarity attendant upon fabricating a 1T1R or a 1D1R RRAM. In accordance with embodiments of the present disclosure, a compact RRAM is formed using an embedded vertical BJT.

Methodology in accordance with embodiments of the present disclosure includes defining a shallow trench isolation (STI) region in a substrate, implanting dopants in the substrate to form a well of a first polarity around and below a bottom portion of the STI region, a band of a second polarity over the well on opposite sides of the STI region, and an active area of the first polarity over each band of second polarity at the surface of the substrate. A hardmask is then formed on the active areas, a top portion of the STI region is removed to form a cavity, an RRAM liner is formed on side and bottom surfaces of the cavity, a top electrode is formed in the cavity, a portion of the hardmask is removed to form spacers on opposite sides of the cavity, and a dopant of the second polarity is implanted in a portion of each active area remote from the cavity.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 4A schematically illustrate a top view of a process flow in accordance with an exemplary embodiment, and FIGS. 1B through 4B schematically illustrate corresponding cross-sectional views of the process flow. Adverting to FIGS. 1A and 1B, STI regions 103 are defined on a p-type substrate 101. The STI regions may be formed to a depth of 100 nanometer (nm) to 1000 nm and to a width of 50 nm to 200 nm, depending on the technology node, and may be formed, for example, of silicon dioxide ($SiO_2$), silicon nitride ($Si_3N_4$), or silicon oxynitride (SiON). N-wells 105 are formed around the bottom portions of the STI regions by implanting N-type dopants (e.g., phosphorus (P), arsenic (As), etc.) at a dosage of 1E12 to 9E13 with an energy of 10 keV to 900 keV depending on the STI depth. Next, a p-band 107 is formed over the n-wells on opposite sides of the STI region by implanting P-type dopant (e.g., boron (B), boron difluoride ($BF_2$), indium (In), etc.) at a dosage of 1E12 to 9E13 and with an energy of 10 keV to 100 keV. Then, a shallow n-type implant is performed over the p-band on opposite sides of the STI region by implanting N-type dopants (e.g., P, As, etc.) at a dosage of 1E12 to 9E13 and with an energy of 1 keV to 10 keV, forming n-type active area 109.

Figure 2A:
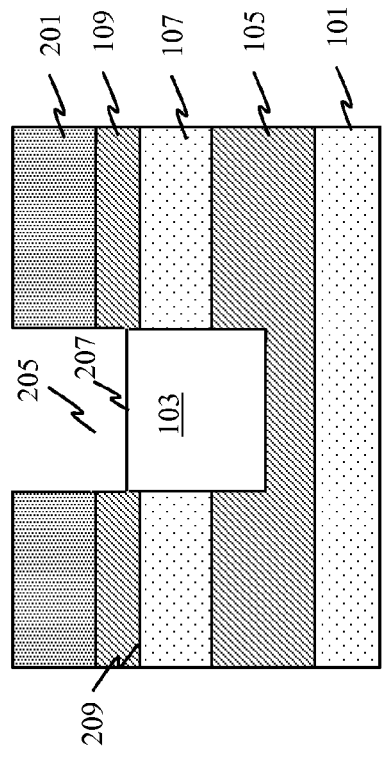
Figure 2B:
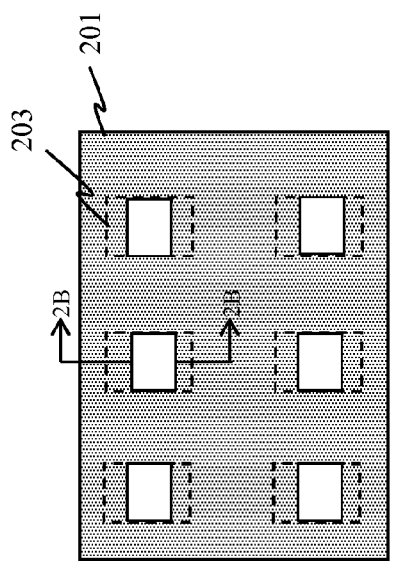
Figure 5B:
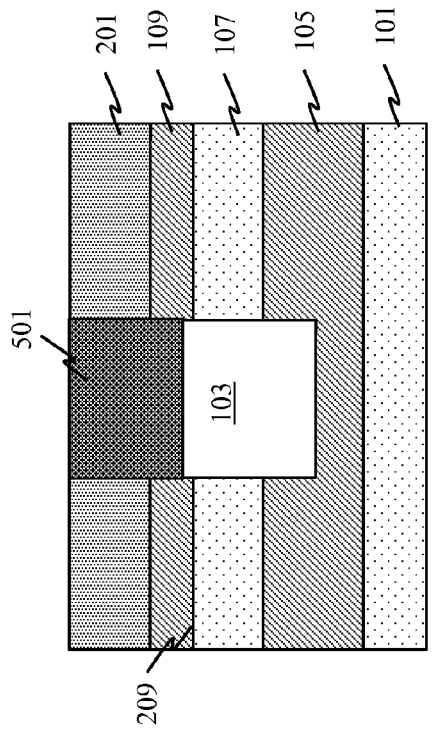

As illustrated in FIGS. 2A and 2B, a hardmask, such as silicon nitride (SiN) 201 is deposited over the entire substrate. Then, using a mask with openings 203, the portion of hardmask 201 over STI regions 103 and a top portion of STI regions 103 are removed, such as by etching, forming cavities 205. After the etching is complete, the bottom surface 207 of cavities 205 must be above a top surface 209 of p-band 107, to prevent short-circuit paths to other terminals.

An RRAM liner 301 is then conformally deposited in cavities 205, as illustrated in FIGS. 3A and 3B. RRAM liner 301 may be formed of titanium oxide ($TiO_x$), nickel oxide ($NiO_x$), hafnium oxide ($HfO_x$), tungsten oxide ($WO_x$), tantalum oxide ($TaO_x$), vanadium oxide ($VO_x$), and copper oxide ($CuO_x$). The RRAM liner 301 may be formed to a thickness of a few nm to hundreds of nm. The remainder of each cavity 205 is then filled with a top electrode 303, followed by an etch-back or chemical mechanical polishing (CMP). Top electrode 303 may be formed of a material such as tungsten (W), platinum (Pt), titanium nitride (TiN), TiN/titanium (Ti), ruthenium (Ru), nickel (Ni), or polysilicon.

Adverting to FIGS. 4A and 4B, hardmask 201 is etched to form spacers 401 on opposite sides of top electrode 303. Then, multiple implantation steps are performed, implanting, for example, P-type dopant (e.g., B, $BF_2$, In, etc.), with different energies ranging from between sub keV (<1 keV) and 1 keV to between 2 keV and 10 keV, depending on the dopant used, to establish a desired implant profile for p-type regions 403. Once the implantations are complete, the dopants may be activated by heating to a temperature of 900° C. to 1100° C. for 1 millisecond (ms) to less than 5 seconds. Alternatively, a laser anneal may be performed to activate the dopants. Nickel silicide (NiSi) is then formed on p-type regions 403, and back-end-of line (BEOL) processing may continue.

FIGS. 5A through 7A schematically illustrate a top view of a process flow in accordance with another exemplary embodiment, in which a gate last approach is utilized, and FIGS. 5B through 7B schematically illustrate corresponding cross-sectional views of the process flow. The process begins the same as the first embodiment, through the formation of cavities 205 by removing both the portion of hardmask 201 over STI regions 103 and also a top portion of STI regions 103, such as by etching. Adverting to FIGS. 5A and 5B, cavities 205 are filled with a sacrificial top electrode 501, formed, for example by depositing polysilicon or amorphous silicon (a-Si).

Figure 6B:
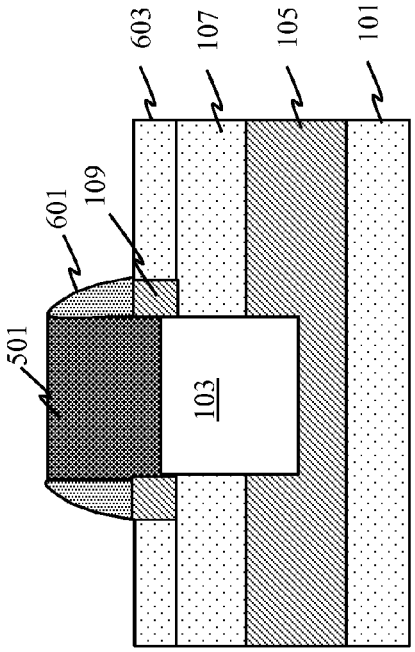
Figure 5A:
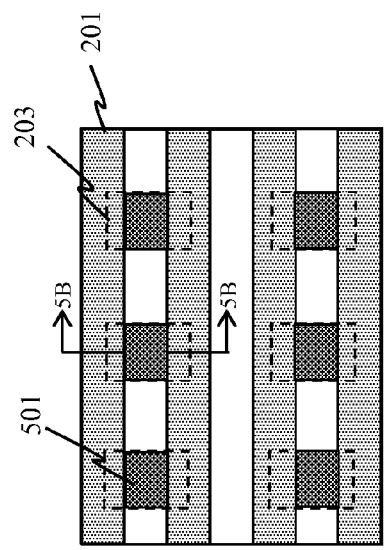
Figure 6A:
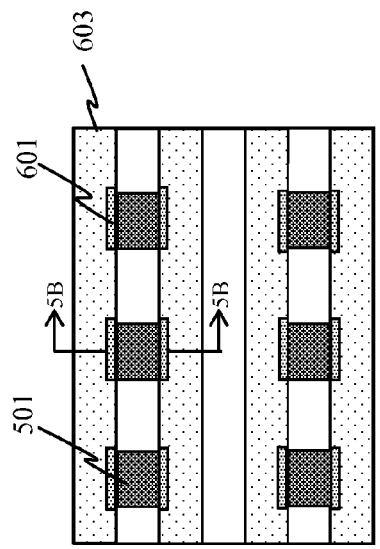

As illustrated in FIGS. 6A and 6B, hardmask 201 is etched to form spacers 601 on opposite sides of sacrificial top electrode 501. Then, multiple implantation steps are performed, implanting, P-type dopant (e.g., B, $BF_2$, In, etc.), with different energies ranging from between sub keV (<1 keV) and 1 keV to between 2 keV and 10 keV, depending on the dopant used, to establish a desired implant profile for p-type regions 603. Once the implantations are complete, the dopants may be activated by heating to a temperature of 900° C. to 1100° C. for 1 millisecond (ms) to less than 5 seconds. Alternatively, a laser anneal may be performed to activate the dopants.

Figure 7B:
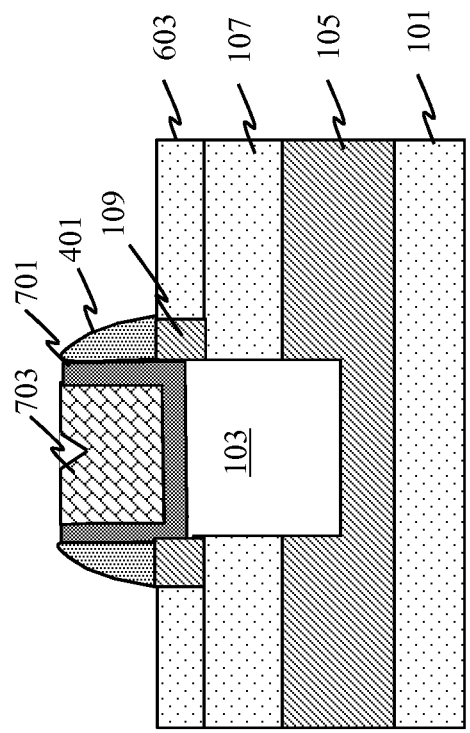
Figure 7A:
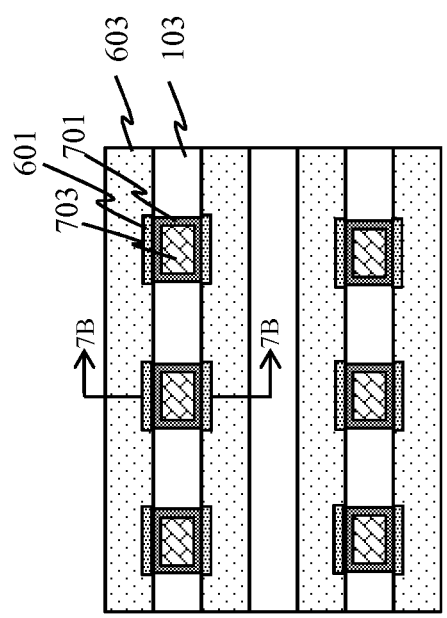

A protection layer (not shown for illustrative convenience), formed for example of $SiO_2$ or SiON, is then deposited over p-type regions 603 (the active regions), and sacrificial top electrode 501 is removed. As illustrated in FIGS. 7A and 7B, an RRAM liner 701 is then conformally deposited in cavities 205. RRAM liner 301 may be formed of titanium oxide ($TiO_x$), nickel oxide ($NiO_x$), hafnium oxide ($HfO_x$), tungsten oxide ($WO_x$, tantalum oxide ($TaO_x$), vanadium oxide ($VO_x$), and copper oxide ($CuO_x$). The RRAM liner 701 may be formed to a thickness of a few nm to hundreds of nm. The remainder of each cavity 205 is then filled with a top electrode 703, followed by an etch-back or chemical mechanical polishing (CMP). Top electrode 703 may be formed of a material such as tungsten (W), platinum (Pt), titanium nitride (TiN), TiN/titanium (Ti), ruthenium (Ru), nickel (Ni), or polysilicon. Nickel silicide (NiSi) is then formed on p-type regions 603, and back-end-of line (BEOL) processing may continue.

Adverting to FIGS. 8A through 8C, a layout of RRAMs of FIGS. 4A and 4B is illustrated. As shown in FIGS. 8A through 8C, a first bit line 801 is connected to the p-type region 403 on one side of the STI region, and a second bit line 803 is connected to the p-type region 403 on the other side of the STI region. A first word line 805 is connected to a first column of top electrodes 303, and a second word line 809 is connected to a second column of top electrodes 303. A select line 807 is formed in n-wells 105.

Read, set, and reset operations of the RRAM at the STI can be achieved by passing current through selected BJTs and RRAM. For example, for a read operation, a high read voltage may be applied to the selected word line, a select read voltage may be applied to the selected bit line, and a low voltage may be applied to the select line. Similarly, for a set operation, a high set voltage may be applied to the selected word line, a select set voltage may be applied to the selected bit line, and a low voltage may be applied to the select line. For reset operations, a select reset voltage may be applied to the selected bit line. Then, for a unipolar reset operation, a high reset voltage may be applied to the selected word line and a low voltage may be applied to the select line, whereas for a bipolar operation, a low reset voltage may be applied to the selected word line and a high voltage may be applied to the select line. In addition, for forming operations, a high forming voltage may be applied to the selected word line, a select forming voltage may be applied to the selected bit line, and a low voltage may be applied to the select line. For all forming, read, set, and reset operations, unselected word lines and unselected bit lines may be floating.

The embodiments of the present disclosure can achieve several technical effects, such as direct access to the RRAM with a high access current through a silicon-based selector (the vertical BJT), cell performance and scalability being independent from the gate oxide and gate length, thereby reducing cell size and increasing scalability, bidirectionality of the RRAM without increasing cell size, and compatibility with both gate first and gate last approaches. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or in any memory product. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a substrate;
a well of a first polarity in the substrate;
a shallow trench isolation (STI) region formed in the substrate extending partially into the well;
bands of a second polarity in the substrate, over the well, at opposite sides of the STI region;
an area of the first polarity at a top surface of the substrate over each band;
an area of the second polarity in the substrate over each band, adjacent each area of the first polarity and remote from the STI region;
a recess in a top portion of the STI region, wherein a bottom surface of the recess is above a top surface of the band;
a resistive random access memory (RRAM) liner on side and bottom surfaces of the recess; and
a top electrode in the recess.

2. The device according to claim 1, wherein the RRAM liner comprises an oxide of a transition metal.

3. The device according to claim 1, wherein a thickness of the RRAM liner is 3 nm to 900 nm.

4. The device according to claim 1, wherein the top electrode comprises a transition metal, titanium nitride (TiN), TiN/Ti, or polysilicon.

5. The device according to claim 1, further comprising silicon nitride (SiN) spacers at opposite sides of the top electrode.

6. The device according to claim 1, wherein the STI region has a depth of 100 to 1000 nm.

7. The device according to claim 1, wherein the STI region comprises silicon dioxide ($SiO_2$), silicon nitride ($Si_3N_4$) or silicon oxynitride (SiON).

8. The device according to claim 1, wherein the well is implanted with phosphorus (P) or arsenic (As).

9. The device according to claim 8, wherein the band of a second polarity is implanted with boron (B), boron difluoride ($BF_2$), or indium (In).

10. A device comprising:
a substrate;
plural wells of a first polarity in the substrate;
shallow trench isolation (STI) regions formed in the substrate, parallel to and separated from each other, each STI region extending partially into a different one of the plural wells;
bands of a second polarity in the substrate, over the wells, at opposite sides of each STI region;
first and second areas of the first polarity at a top surface of the substrate over each band, at opposite sides of each STI region;
first and second areas of the second polarity in the substrate over each band, adjacent the first and second areas, respectively, of the first polarity and remote from the corresponding STI region;
a recess in a top portion of each STI region, wherein a bottom surface of each recess is above a top surface of each band;
a resistive random access memory (RRAM) liner on side and bottom surfaces of each recess; and
a top electrode in each recess.

11. The device according to claim 10, wherein each RRAM liner comprises an oxide of a transition metal.

12. The device according to claim 10, wherein a thickness of each RRAM liner is 3 nm to 900 nm.

13. The device according to claim 10, wherein the top electrode comprises a transition metal, titanium nitride (TiN), TiN/Ti, or polysilicon.

14. The device according to claim 10, further comprising silicon nitride (SiN) spacers at opposite sides of each top electrode.

15. The device according to claim 10, wherein each STI region has a depth of 100 to 1000 nm.

16. The device according to claim 10, wherein each STI region comprises silicon dioxide ($SiO_2$), silicon nitride ($Si_3N_4$) or silicon oxynitride (SiON).

17. The device according to claim 10, wherein each well is implanted with phosphorus (P) or arsenic (As).

18. The device according to claim 17, wherein each band of a second polarity is implanted with boron (B), boron difluoride ($BF_2$), or indium (In).

19. The device according to claim 10, further comprising:
first and second bit lines connected to the first and second areas of second polarity, respectively;
first and second word lines connected to first and second columns of top electrodes, respectively;
and a select line formed in the wells.

20. A device comprising:
a substrate;
plural wells of a first polarity in the substrate;
shallow trench isolation (STI) regions formed in the substrate, parallel to and separated from each other, each STI region extending partially into a different one of the plural wells;
bands of a second polarity in the substrate, over the wells, at opposite sides of each STI region;
first and second areas of the first polarity at a top surface of the substrate over each band, at opposite sides of each STI region;
first and second areas of the second polarity in the substrate over each band, adjacent the first and second areas of the first polarity, respectively, and remote from the corresponding STI region;
a recess in a top portion of each STI region, wherein a bottom surface of each recess is above a top surface of each band;
a resistive random access memory (RRAM) liner comprising an oxide of a transition metal having a thickness of 3 nm to 900 nm on side and bottom surfaces of each recess;
a top electrode comprising a transition metal, titanium nitride (TiN), TiN/Ti, or polysilicon in each recess;
silicon nitride (SiN) spacers at opposite sides of each top electrode;
first and second bit lines connected to the first and second areas of second polarity, respectively;
first and second word lines connected to first and second columns of top electrodes, respectively; and
a select line formed in the wells.

\* \* \* \* \*